(12) United States Patent
Tanno et al.

(10) Patent No.: US 8,091,766 B2
(45) Date of Patent: Jan. 10, 2012

(54) METHOD AND APPARATUS FOR LOADING SOLDER BALLS

(75) Inventors: Katsuhiko Tanno, Gifu (JP);
Youichirou Kawamura, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/180,830

(22) Filed: Jul. 28, 2008

(65) Prior Publication Data

US 2009/0026250 A1   Jan. 29, 2009

Related U.S. Application Data

(63) Continuation of application No. PCT/JP2007/051273, filed on Jan. 26, 2007.

(30) Foreign Application Priority Data

Jan. 27, 2006  (JP) ................................. 2006-019064

(51) Int. Cl.
  *B23K 31/02*  (2006.01)
  *H01L 21/44*  (2006.01)
(52) U.S. Cl. ....... 228/246; 228/41; 228/248.1; 228/254; 438/626
(58) Field of Classification Search .................... 228/41, 228/246, 248.1, 254; 438/626
  See application file for complete search history.

(56) References Cited

U.S. PATENT DOCUMENTS

| | | | | |
|---|---|---|---|---|
| 5,921,458 A | * | 7/1999 | Fan | 228/41 |
| 6,162,661 A | * | 12/2000 | Link | 438/108 |
| 2002/0058406 A1 | * | 5/2002 | Mukuno et al. | 438/626 |
| 2006/0157540 A1 | | 7/2006 | Sumita et al. | |
| 2007/0251089 A1 | | 11/2007 | Kawamura et al. | |
| 2008/0120832 A1 | | 5/2008 | Kawamura et al. | |

FOREIGN PATENT DOCUMENTS

| | | |
|---|---|---|
| JP | 03-265150 | 11/1991 |
| JP | 2001-244288 | 9/2001 |
| JP | 2001-267731 | 9/2001 |
| JP | 2001-358450 | 12/2001 |
| JP | 2003-258016 | 9/2003 |
| WO | 2006/013742 A1 | 2/2006 |

OTHER PUBLICATIONS www.dictionary.com Random House Dictionary, "Gather".*

* cited by examiner

*Primary Examiner* — Jessica L Ward
*Assistant Examiner* — Erin Saad
(74) *Attorney, Agent, or Firm* — Oblon, Spivak, McClelland, Maier & Neustadt, L.L.P.

(57) ABSTRACT

A solder ball loading apparatus for loading solder balls onto pads of a printed wiring board includes a holding device for holding a printed wiring board having pads and holding a ball array mask having of openings that correspond to pads of the printed wiring board, one or more cylinder members positioned over the holding device such that an opening portion of the cylinder member faces the holding device, the cylinder member gathering solder balls on the surface of the ball array mask under the cylinder member by suctioning air through the opening portion of the cylinder member, and a conveyor mechanism for moving the ball array mask and the printed wiring board relative to the cylinder member such that solder balls gathered under the opening portion of the cylinder member can be loaded onto the pads of the printed wiring board through the openings of the ball array mask held by the holding device.

11 Claims, 8 Drawing Sheets

FIG. 1
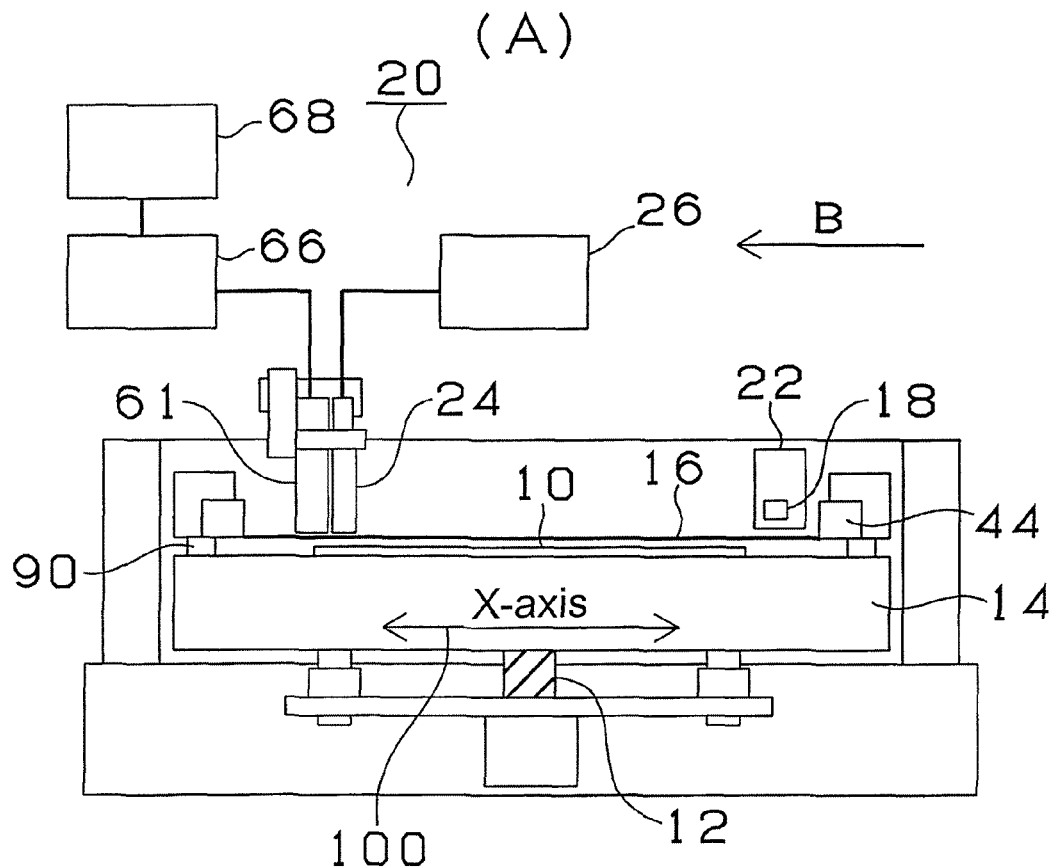
(A)
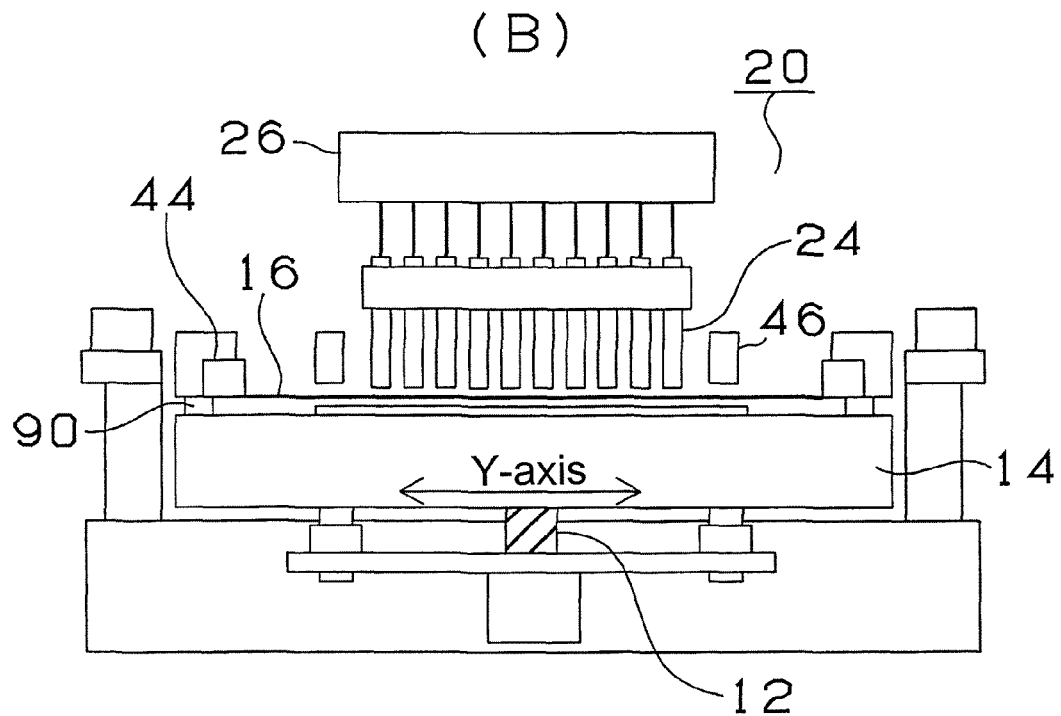
(B)

FIG. 2
(A)
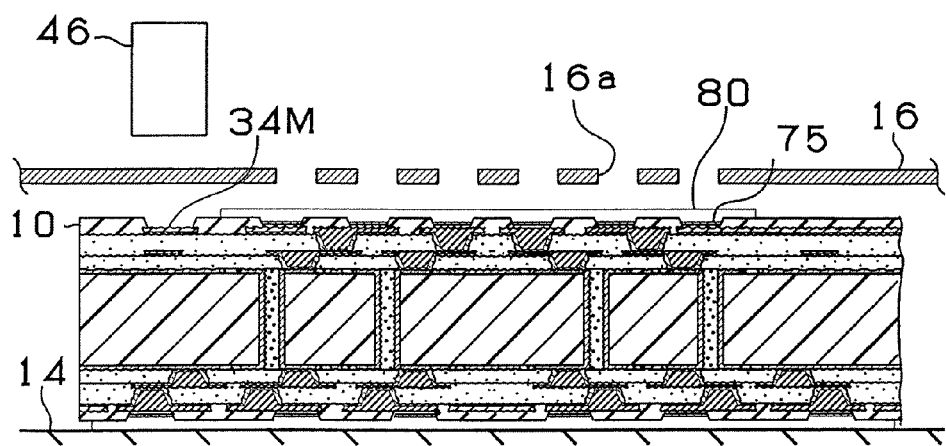
(B)
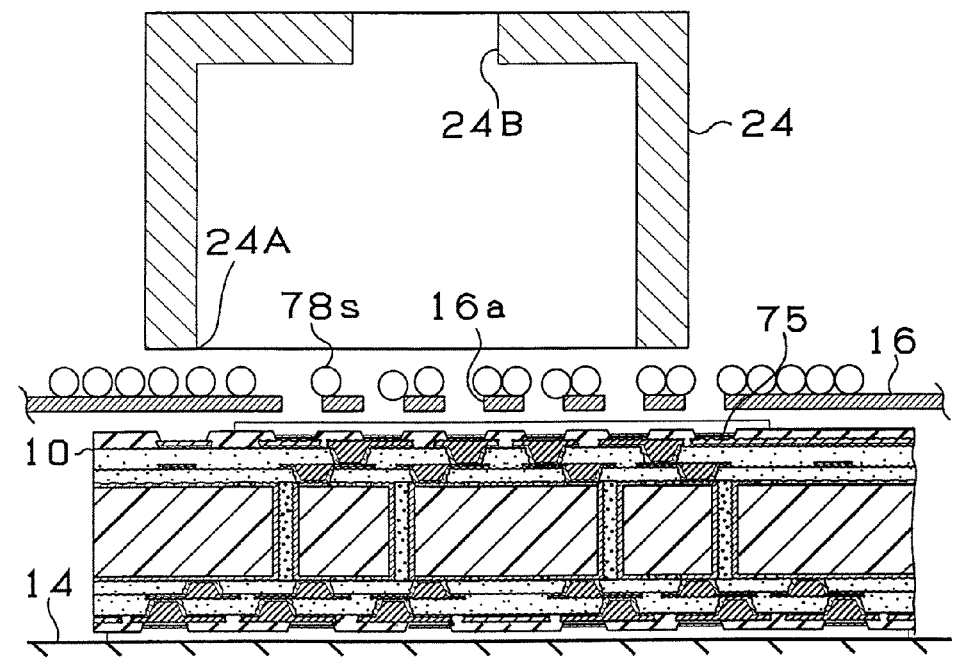

FIG. 4
(A)
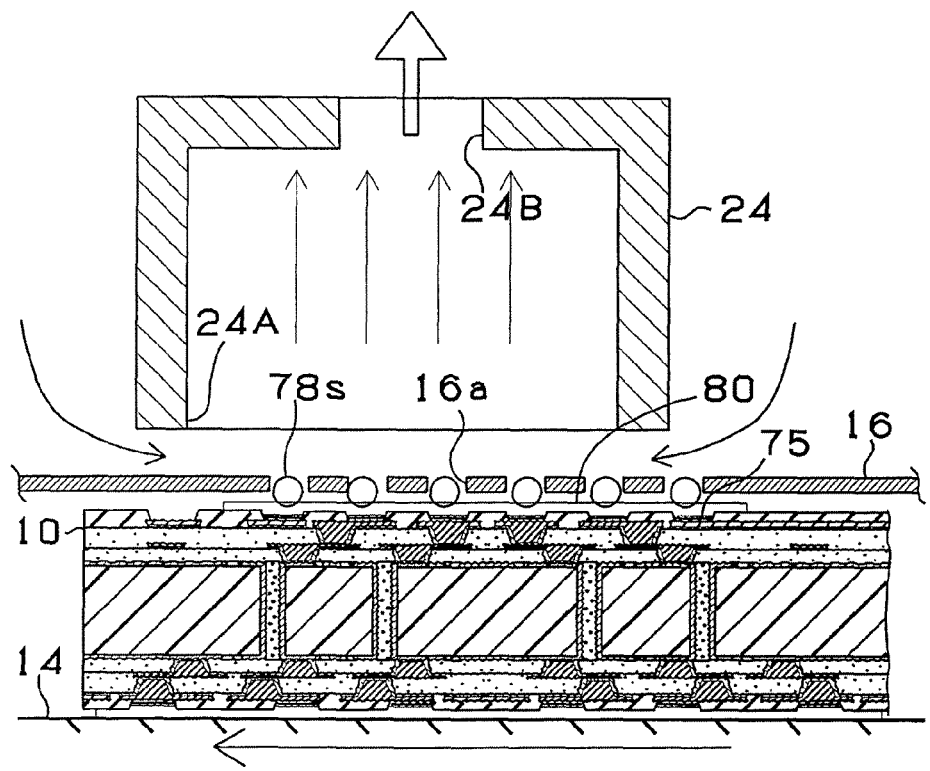
(B)
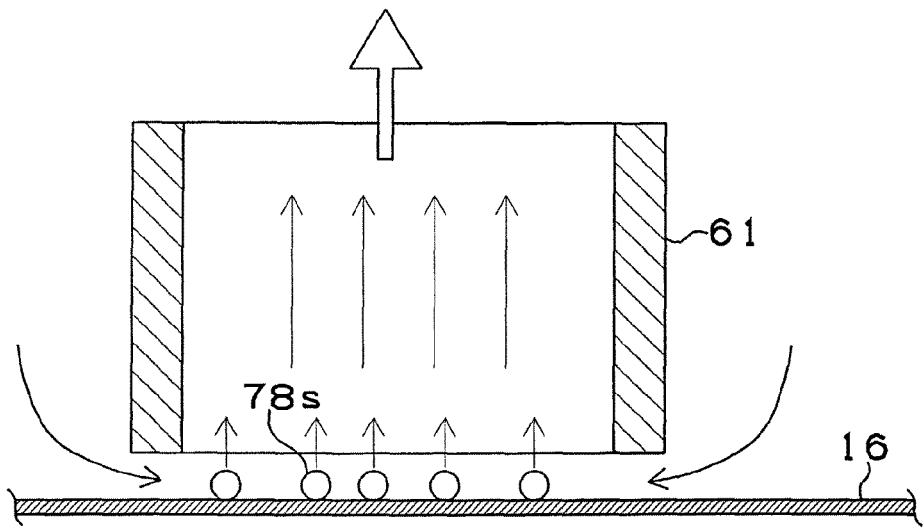

FIG. 8
(A)
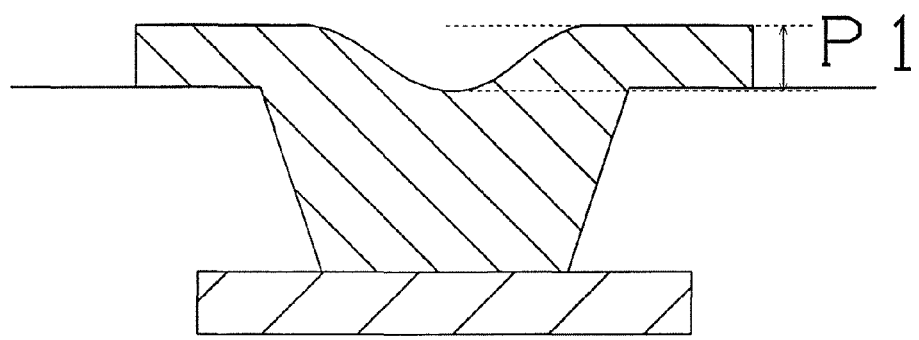
(B)
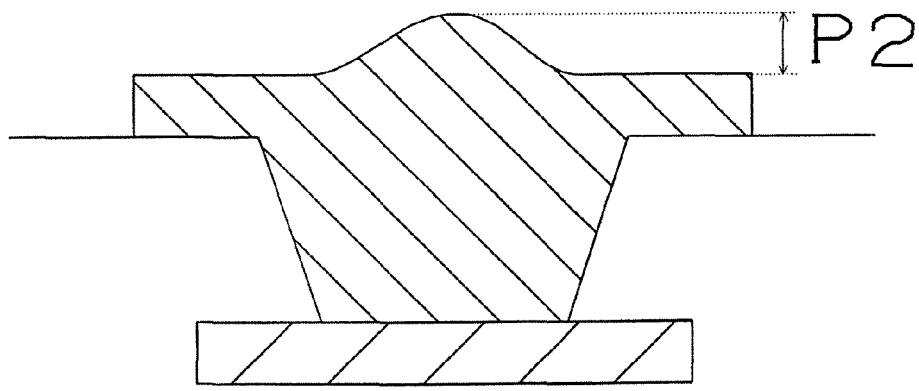

METHOD AND APPARATUS FOR LOADING SOLDER BALLS

CROSS REFERENCE TO RELATED APPLICATIONS

This application is a continuation of PCT/JP07/51273, filed Jan. 26, 2007, which claims priority to Japanese patent application No. 2006-019064, filed Jan. 27, 2006, the entire contents of each of which are incorporated herein by reference.

BACKGROUND OF THE INVENTION

1. Field of the Invention

The present invention relates to a method and apparatus for loading onto a printed wiring board solder balls which will become solder bumps.

2. Discussion of the Background

Solder bumps are used for electrical connection between a package substrate and an IC chip. Solder bumps are formed by the following steps:

(1) a step to print flux on electrodes formed in a package substrate;
(2) a step to load solder balls onto the electrodes on which the flux is printed; and
(3) a step to form solder bumps from the solder balls by a reflow.

In the above step to load solder balls onto electrodes, for example, as described in Japanese Patent No. 1975429, solder balls are suctioned by a suction head and then loaded onto electrodes. As described in Japanese Laid-Open Patent Application 2001-358450, using a ball array mask having multiple openings, solder balls are dropped onto electrodes. Japanese Laid-Open Patent Application 2001-267731 discloses another example method of loading solder balls. The entire contents of each of these publications are incorporated herein by reference.

SUMMARY OF THE INVENTION

According to one aspect of the present invention, a method of loading solder balls onto pads of a printed wiring board includes providing solder balls onto a surface of a ball array mask having openings that are aligned with pads on a printed wiring board, positioning a cylinder member having an opening portion over the ball array mask such that the opening portion of the cylinder member faces the surface of the ball array mask having the solder balls thereon, gathering the solder balls on the surface of the ball array mask under the cylinder member by suctioning air through the opening portion of the cylinder member, and moving the ball array mask and the printed wiring board relative to the cylinder member such that the pads of the printed wiring board are loaded, through the openings of the ball array mask, with the solder balls gathered under the cylinder member.

According to another aspect of the present invention, a solder ball loading apparatus for loading solder balls onto pads of a printed wiring board includes a holding device for holding a printed wiring board having pads and holding a ball array mask having of openings that correspond to pads of the printed wiring board, one or more cylinder members positioned over the holding device such that an opening portion of the cylinder member faces the holding device, the cylinder member gathering solder balls on the surface of the ball array mask under the cylinder member by suctioning air through the opening portion of the cylinder member, and a conveyor mechanism for moving the ball array mask and the printed wiring board relative to the cylinder member such that solder balls gathered under the opening portion of the cylinder member can be loaded onto the pads of the printed wiring board through the openings of the ball array mask held by the holding device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein:

FIG. 1(A) is a structural view illustrating a solder-ball loading apparatus according to an embodiment of the present invention;

FIG. 1 (B) is a view illustrating the solder-ball loading apparatus shown in FIG. 1(A), as seen from the direction of arrow B;

FIG. 2(A) is a view illustrating how to position a multilayered printed wiring board;

FIG. 2(B) is a view illustrating how to supply solder balls for a loading cylinder, according to an embodiment of the invention;

FIG. 4(A) is a view illustrating how to drop solder balls onto pads;

FIG. 4(B) is a view illustrating how to remove solder balls using a ball-removal cylinder, according to an embodiment of the invention;

FIGS. 8(A) and 8(B) are views illustrating an example of filled vias.

DETAILED DESCRIPTION

Figure 3:
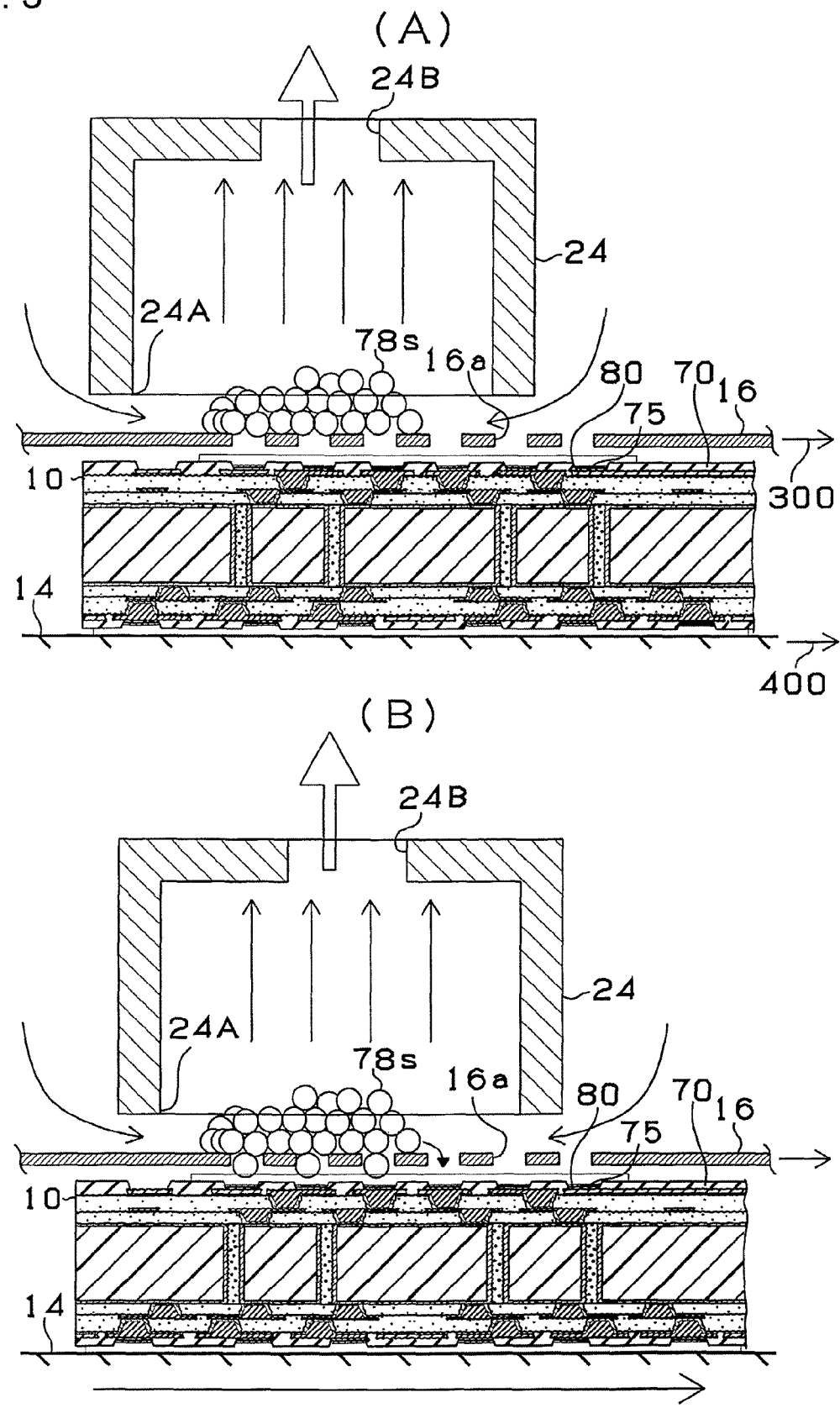
FIG. 3(A) is a view illustrating how to gather solder balls using a loading cylinder.
FIG. 3(B) is a view illustrating how to gather and guide solder balls using the loading cylinder, according to an embodiment of the invention.

As ICs become more highly integrated, solder bumps on a package substrate are required to be made with a much smaller diameter and narrower pitches. Consequently, the diameter of solder balls has become even smaller than that of a grain of sand, for example smaller than 200 μm, and the yield in the above-described conventional method, using a suction head to load solder balls, has been reduced. Also, in the conventional method using both a ball array mask and a squeegee, varying height of solder bumps has resulted in lower quality and lower reliability of the end device.

Namely, if the diameter of solder balls becomes smaller, the ratio of the weight to the surface area decreases, thus causing an attraction phenomenon among solder balls due to intermolecular forces. Therefore, when the above-described suction head is used, even if air is pumped down from above the electrodes to drop solder balls, the balls stick to the suction head and do not fall onto electrodes due to their attraction force. Accordingly, this creates a problem of missing solder bumps on some electrodes.

On the other hand, when a ball array mask is used, due to the attraction phenomenon involving the solder balls, the balls cling together. Therefore, even if a printed wiring board with the loaded ball array mask is tilted, the solder balls do not roll down the mask. Thus it is difficult to drop the solder balls through the openings of the ball array mask. When the ball array mask is not tilted, the solder balls can be moved by a squeegee. Since the clung-together solder balls touch the squeegee during the move, the solder balls are damaged. Accordingly, as described above, the height of the solder bumps varies, resulting in low quality and reliability. Especially, in a printed wiring board with a substantially uneven surface, such as a built-up multilayered wiring board, it is difficult to move solder balls with a squeegee without damaging the solder balls.

One objective of the present invention is to provide a solder-ball loading method and a solder-ball loading apparatus for loading fine solder balls onto pads.

One embodiment of the present invention relates to a method for loading solder balls. By using a ball array mask having multiple openings corresponding to the pads of a printed wiring board, solder balls that will become solder bumps are loaded onto the pads of the printed wiring board. Above the ball array mask, a cylinder member having an opening portion facing the ball array mask is positioned; by suctioning air using the cylinder member, solder balls are gathered to a section of the ball array mask directly under the cylinder member. By horizontally moving the ball array mask and the printed wiring board, the solder balls gathered directly under the cylinder member are dropped onto the pads on the printed wiring board through the openings of the ball array mask.

Another embodiment of the invention relates to a solder-ball loading apparatus, which loads onto pads of a printed wiring board solder balls that will become solder bumps. The apparatus includes a ball array mask with multiple openings corresponding to the pads of a printed wiring board, a cylinder member positioned above the ball array mask to gather solder balls in a section directly under its opening by suctioning air through the opening, and a conveyor mechanism to horizontally move the ball array mask and the printed wiring board. More specifically, by horizontally moving the ball array mask and the printed wiring board, the solder balls gathered directly under the cylinder member are dropped onto the pads of the printed wiring board through the openings of the ball array mask.

According to embodiments of the solder-ball loading method and apparatus, a cylinder member is positioned above a ball array mask and by suctioning air through the opening portion of the cylinder member, solder balls are gathered. Then by horizontally moving the ball array mask and the printed wiring board, the solder balls gathered directly under the cylinder member are moved on the ball array mask and dropped onto the pads of the printed wiring board through the openings in the ball array mask. Accordingly, fine solder balls can be securely loaded onto every pad (or essentially every pad) on the printed wiring board. Also, since solder balls are moved without contact, unlike methods using a squeegee, the solder balls may be loaded onto the pads without damage, thus the height of the solder bumps may be more uniform. Furthermore, according to embodiments of the invention solder balls may be properly loaded onto a printed wiring board having a substantially uneven surface, such as a built-up multilayered wiring board. In addition, where the cylinder member is secured while the ball array mask and the printed wiring board are moved, in contrast to a case in which the cylinder member is moved, the drive unit may be set under the printed wiring board. Thus, the risk of a foreign substance being dropped onto the printed wiring board from the drive unit having a movable member may be prevented.

According to one embodiment of the solder-ball loading apparatus, multiple cylinder members are arranged in proportion to the width of a printed wiring board. Thus, by simply moving the ball array mask and the printed wiring board in a direction perpendicular to the direction in which the cylinder members are lined up, solder balls can be securely loaded onto every pad (or essentially every pad) on the printed wiring board.

According to another embodiment of the solder-ball loading apparatus, using the suction cylinder, solder balls remaining on the ball array mask may be collected and recovered. Thus, remaining excess solder balls can be prevented from becoming obstacles that may cause trouble in the manufacturing process.

According to another embodiment of the solder-ball loading apparatus, at least the area of the cylinder member where solder balls may come in contact is formed with a conductive material. When moving solder balls on the ball array mask to feed them, the solder balls may be charged with electricity from colliding with each other. Where at least the area of the cylinder member where solder balls may come in contact is formed with a conductive material, lightweight solder balls with a small diameter can be prevented from sticking or clinging to the cylinder member due to static electricity. Accordingly, solder balls can be securely loaded onto a printed wiring board.

Figure 6:
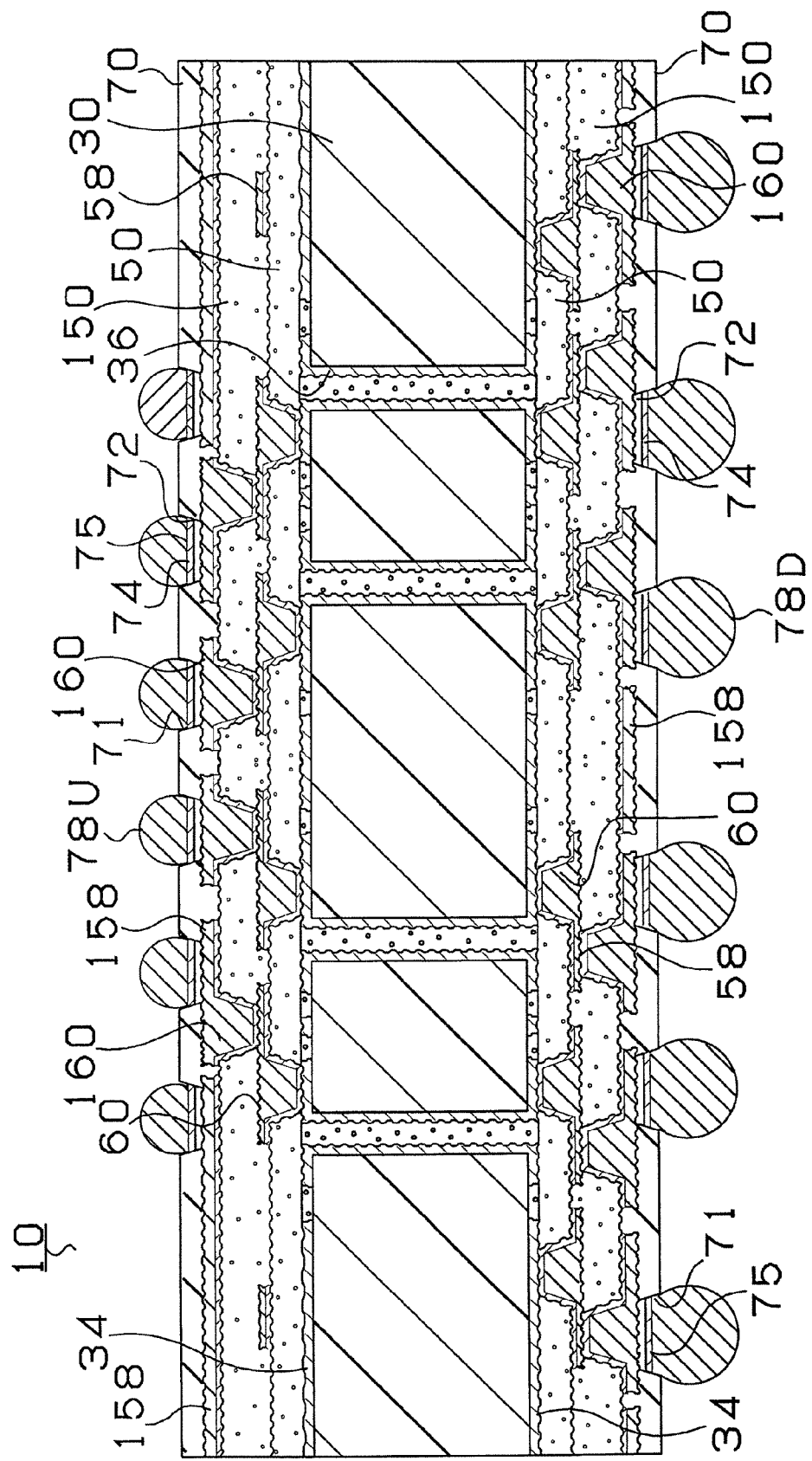
FIG. 6 is a cross-sectional view of a multilayered printed wiring board, according to an embodiment of the invention.
Figure 7:
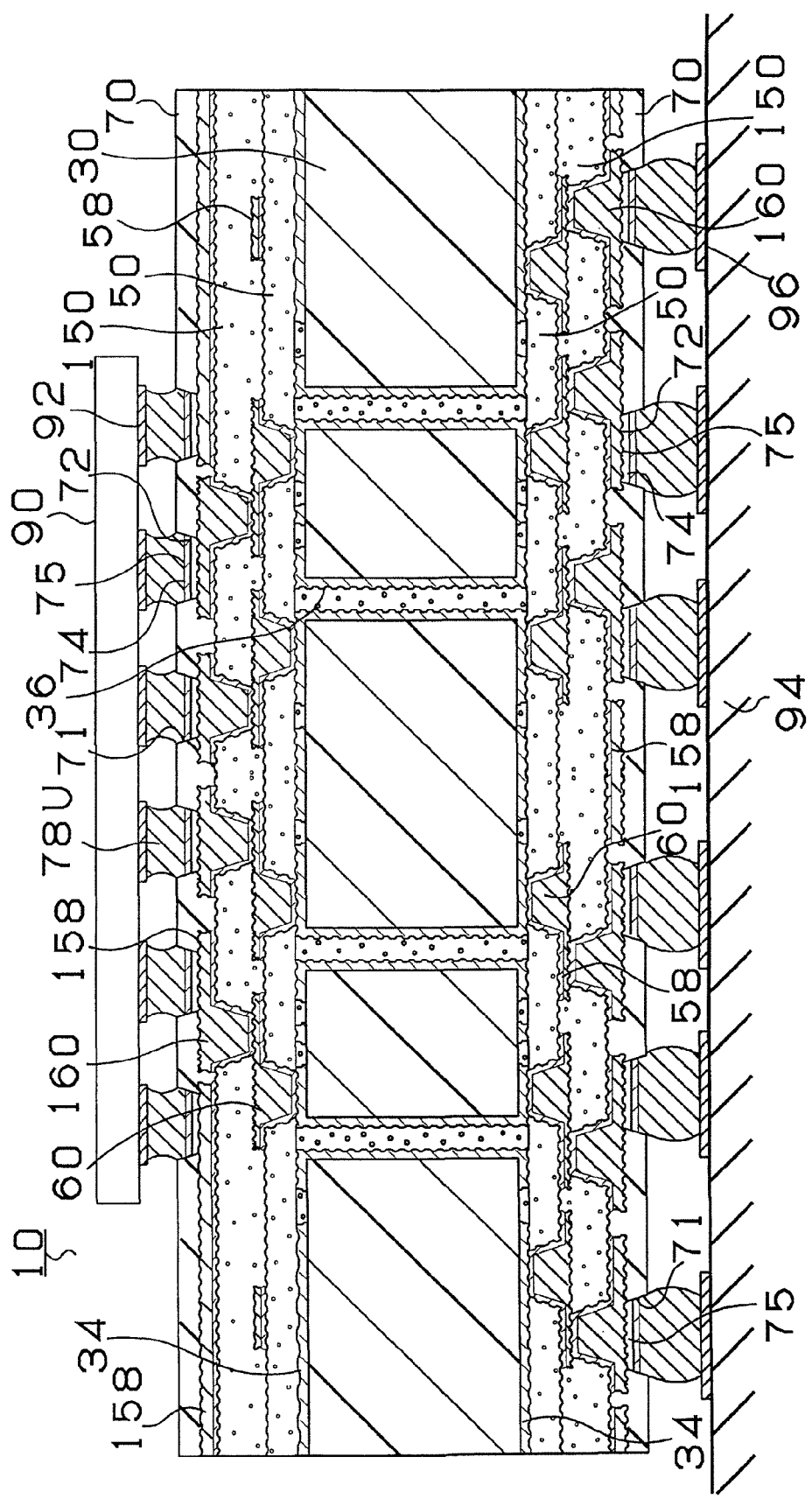
FIG. 7 is a cross-sectional view illustrating a multilayered printed wiring board with a mounted IC chip and installed on a daughter board, according to an embodiment of the invention.

The structure of multilayered printed wiring board 10, which can be manufactured by the method and apparatus for loading solder balls according to an example of the present invention, is described with reference to FIGS. 6-7. FIG. 6 is a cross-sectional view of multilayered printed wiring board 10, and FIG. 7 is a view illustrating the multilayered printed wiring board 10 shown in FIG. 6 with a mounted IC chip 90, and installed on daughter board 94. As shown in FIG. 6, in multilayered printed wiring board 10, conductive circuits 34 are formed on both surfaces of core substrate 30. The upper surface and the lower surface of core substrate 30 are connected via through-holes 36.

Furthermore, on conductive circuit 34 on core substrate 30, conductive circuit 58, which forms a conductive circuit layer, is formed via interlayer resin insulation layer 50. Conductive circuit 58 is connected to conductive circuit 34 through via-holes 60. On conductive circuit 58, conductive circuit 158 is formed via interlayer resin insulation layer 150. Conductive circuit 158 is connected to conductive circuit 58 through via holes 160 formed in interlayer resin insulation layer 150.

On via holes 160 and conductive circuit 158, solder-resist layer 70 is formed. In openings 71 of solder-resist layer 70, nickel-plated layer 72 and gold-plated layer 74 are deposited to form pads 75. On pads 75 formed on the upper surface, solder bumps (78U) are formed; and on pads 75 formed on the lower surface, BGA (ball grid array) (78D) is formed. As shown in FIG. 7, solder bumps (78U) on the upper surface of multilayered printed wiring board 10 are connected to electrodes 92 of IC chip 90. Meanwhile, BGA (78D) on the lower surface is connected to lands 96 of daughter board 94.

Figure 5:
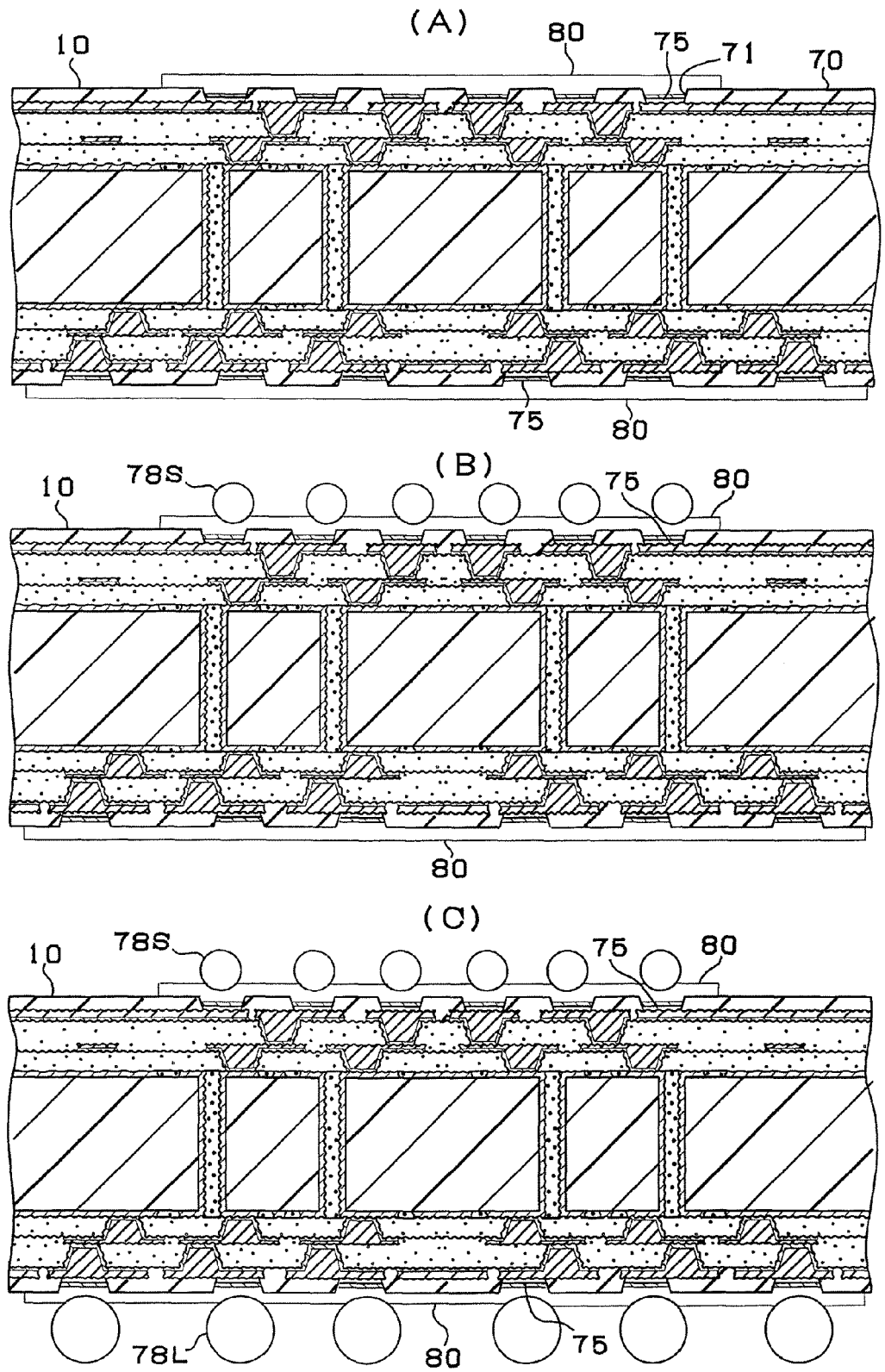
FIGS. 5(A), 5(B) and 5(C) are views illustrating manufacturing steps of a multilayered printed wiring board, according to an embodiment of the invention.

FIGS. 5(A)-5(C) are views illustrating steps to form solder bumps on multilayered printed wiring board 10. As shown in FIG. 5(A), on the surface of multilayered printed wiring board 10, where pads 75 are formed in openings 71 of solder-resist layer 70, flux 80 is printed. As shown in FIG. 5(B), using the later described solder-ball loading apparatus, microscopic solder balls (78s) (such as, for example, made by Hitachi Metals, Ltd. or Tamura Co., with a diameter of 40 μm or larger, but less than 200 μm) are loaded over pads 75 formed on the upper surface of multilayered printed wiring board 10. To deal with products having finer features, solder balls with a diameter less than 200 μm are preferred. If the diameter is less than 40 μm, solder balls may become too lightweight, and it is difficult to drop them onto pads. On the other hand, if the diameter is 200 μm or larger, solder balls may become too heavy to be gathered by the cylinder member, thus the number of pads without solder balls may increase.

Then, as shown in FIG. 5(C), using a suction head related to conventional technology disclosed in Japanese Patent No. 1975429 for example, solder balls (78L) with a regular diameter (250 μm in diameter) are suctioned and loaded over pads 75 on the lower surface of multilayered printed wiring board 10. Then, after being heated in a reflow furnace, as shown in FIG. 6, on the upper surface of multilayered printed wiring board 10, solder bumps (78U), for example 2,000 of them, are formed at a pitch in the range of 60-150 μm. On the lower surface, BGA (78D), for example, 250 solder bumps are formed at about a 2-mm pitch. If the pitch is smaller than 60 μm, it may be difficult to manufacture solder balls appropriate to such a pitch. If the pitch exceeds 150 μm, the solder balls may be easily produced by the method of the present invention, but might also be produced by conventional methods as well. Furthermore, as shown in FIG. 7, by reflow, IC chip 90 is mounted through solder bumps (78U), and then multilayered printed wiring board 10 having mounted IC chip 90 is installed on daughter board 94 via BGA (78D).

FIGS. 1 (A) and 1(B) illustrate a solder-ball loading apparatus, by which fine solder balls (78s) (with a diameter less than 200 μm) are loaded onto pads of a multilayered printed wiring board as described above in reference to FIG. 5(B). FIG. 1(A) is a structural view showing the structure of a solder-ball loading apparatus according to an embodiment of the present invention. FIG. 1 (B) is a view, as seen from the direction of arrow B, illustrating the solder-ball loading apparatus shown in FIG. 1 (A).

Solder-ball loading apparatus 20 has XYθ suction table 14 that determines and maintains the position for multilayered printed wiring board 10, elevator shaft 12 that vertically moves the XYθ suction table 14 up and down, and ball array mask 16 that has openings corresponding to pads 75 of the multilayered printed wiring board. Also included is loading cylinder (cylinder member) 24 that guides solder balls, suction box 26 that provides a negative pressure for loading cylinder 24, ball-removal cylinder 61 that collects and recovers excess solder balls, and suction box 66 that provides a negative pressure for ball-removal cylinder 61. Further included is a ball-removal suction device 68 that holds removed solder balls, mask clamp 44 that clamps ball array mask 16, alignment camera 46 that that creates an image of multilayered printed wiring board 10, residue detection sensor 18 that detects the remaining number of solder balls under loading cylinder 24, and solder-ball supply device 22 that supplies solder balls for loading cylinder 24 according to the remaining number of balls detected by residue detection sensor 18. In one embodiment, a holding device includes a surface for supporting a printed wiring board and a clamp for holding a mask.

Loading cylinder 24 and ball-removal cylinder 61 are arranged in multiple numbers in the Y-direction according to the size of the connection pad region. The number may also be determined according to the size of multiple connection pad regions. Here, the Y-direction is arbitrary, and they may be arranged in the X-direction as well. XYθ suction table 14 performs positioning, suctioning, holding, adjusting and moving of multilayered printed wiring board 10 onto which solder balls are loaded. Here, XYθ suction table 14 may be moved with ball array mask 16 clamped by mask clamp 44 when moving printed wiring board 10. Ball array mask 16 and XYθ suction table 14 are fixed each other by fixing device or means. For example, ball array mask 16 clamped by mask clamp 44 may be held by frame structure integrally connected or fixedly attached through connecting body 90 to XYθ suction table 14. Thus, ball array mask 16 and multilayered printed wiring board 10 held on XYθ suction table 14 are moved together with respect to loading cylinder 24. Alignment camera 46 detects the alignment marks of multilayered printed wiring board 10 positioned on XYθ suction table 14. According to the detected position, the alignment between multilayered printed wiring board 10 and ball array mask 16 is adjusted. Residue detection sensor 18 detects the remaining number of solder balls by an optical method.

In solder-ball loading apparatus 20 according to the embodiment of FIG. 1(A) and FIG. 1(B), loading cylinder 24 is secured, and ball array mask 16 and printed wiring board 10 are moved. Thus, in contrast to cases in which loading cylinder 24 is moved, a drive unit (XYθ suction table 14) may be set under printed wiring board 10. Accordingly, the risk of a foreign substance being dropped onto the printed wiring board from the drive unit having a movable member may be prevented.

An example of using solder-ball loading apparatus 20 to load solder balls is now described in reference to FIGS. 2-4.

(1) Recognizing and adjusting the position of the multilayered printed wiring board.

As shown in FIG. 2(A), alignment mark (34M) of multilayered printed wiring board 10 is recognized by alignment camera 46, and the position of multilayered printed wiring board 10 relative to ball array mask 16 is adjusted using XYθ suction table 14. Namely, the position is adjusted so that openings (16a) of ball array mask 16 correspond to pads 75 of multilayered printed wiring board 10 respectively. Once the printed wiring board 10 and ball array mask 16 are aligned, they are fixed relative to each other by a clamp as described above. Here, for illustration purposes, only a single multilayered printed wiring board 10 is shown. However solder balls may be loaded onto a work-sheet-size multilayered printed wiring board containing multiple sheets of multilayered printed wiring boards. Then, after solder bumps are formed, each multilayered printed wiring board is cut out of the work-sheet-sized board.

(2) Supplying solder balls.

As shown in FIG. 2(B), a predetermined number of solder balls (78s) are supplied from solder-ball supply unit 22 to loading cylinder 24.

(3) Loading solder balls.

As shown in FIG. 3(A), loading cylinder 24 is positioned over ball array mask 16, while keeping a predetermined clearance (for example, 100%-300% of the ball diameter). Then, by suctioning air from suction section (24B), the air flow between the loading cylinder and the printed wiring board is preferably set in the range of 5 m/sec. to 50 m/sec., and solder balls (78s) are gathered on ball array mask 16 directly under opening portion (24A) of loading cylinder 24. This gathering of the solder balls 78s by suction air loosely aggregates the solder balls 78s under the loading cylinder and can minimize or reduce attraction forces between the solder balls. After that, as shown by the arrows 300, 400 in FIGS. 3(B), printed wiring board 10 and ball array mask 16 are horizontally moved along the X-axis using XYθ suction table 14. Movement of the printed wiring board 10 and ball array mask 16 by suction table 14 is also shown by the arrows 100, in FIGS. 1(A). By such movement, solder balls (78s) that have been gathered directly under loading cylinder 24 are moved while ball array mask 16 and printed wiring board 10 are moved, then the balls are dropped onto pads 75 of multilayered printed wiring board 10 through openings (16a) of ball array mask 16. Accordingly, solder balls (78s) are loaded onto all the pads on multilayered printed wiring board 10.

(4) Removing the stuck solder balls.
As shown in FIG. 4(B), by moving printed wiring board 10 and ball array mask 16, excess solder balls (78s) are guided to the area where there are no openings (16a) of ball array mask 16. The excess solder balls are then suctioned and removed through ball-removal cylinder 61.

(5) Removing the substrate.
The multilayered printed wiring board 10 is then removed from XYθ suction table 14.

According to an embodiment of the method for loading solder balls and solder-ball loading apparatus 20, loading cylinder 24 is positioned above ball array mask 16, and by suctioning air through opening (24B) of loading cylinder 24, solder balls (78s) are gathered. Then, by horizontally moving ball array mask 16 and printed wiring board 10, gathered solder balls (78s) are moved on ball array mask 16 and dropped onto pads 75 of multilayered printed wiring board 10 through openings (16a) of ball array mask 16. Accordingly, microscopic solder balls (78s) may be securely loaded onto every pad 75 (or essentially every pad) of multilayered printed wiring board 10. Also, since solder balls (78s) are moved without making any contact, unlike cases using a squeegee, the solder balls may be loaded onto pads 75 without damage. Thus, the height of solder bumps (78U) may be uniform. Accordingly, mountability of electronic components such as an IC chip, heat cycle tests after mounting, and tests for environmental resistance such as high-temperature and high-humidity tests show excellent results. Furthermore, since a flat surface is not required, a printed wiring board with an uneven surface may be loaded with solder balls appropriately onto its pads. Also, small solder balls such as microscopic solder balls may be loaded securely onto pads. Thus, for example, in a printed wiring board having a pad pitch in the range of 60-150 μm and an opening diameter of the solder resist in the range of 40-100 μm, all solder bumps may have a uniform bump height.

In addition, since solder balls are guided with suction force, solder balls may be prevented from clinging or sticking to each other or to components of the loading apparatus. Furthermore, by adjusting the number of loading cylinders 24, varieties of works (work-sheet-size multilayered printed wiring boards) may be handled, thus making possible its flexible application on a variety of products and production in small quantities.

According to the embodiment of the solder-ball loading apparatus as shown in FIG. 1(B), multiple loading cylinders 24 are arranged in the Y-direction in proportion to the width of the work (a work-sheet size multilayered printed wiring board). Therefore, by moving ball array mask 16 and printed wiring board 10 in a direction perpendicular to the direction (the X-direction) in which loading cylinders 24 are lined up, solder balls may be securely loaded onto all pads 75 of multilayered printed wiring board 10.

Moreover, by using ball-removal cylinder 61, remaining solder balls (78s) left on the ball array mask 16 may be collected and removed. Accordingly, residual solder balls will not cause trouble such as a breakdown of the solder ball loading apparatus.

In the following, a comparison test and its results are described. In the test, solder bumps manufactured by the method for loading solder balls according to an example of the invention are compared with solder bumps manufactured by a conventional method.

EXAMPLE (1) Manufacturing a printed wiring board.
As a starting material, double-sided copper-clad laminate (for example, "MCL-E-67" made by Hitachi Chemical Co., Ltd.) is used, and through-hole conductors and conductive circuits are formed on the substrate by a conventional method. Then, using a conventional method (such as "Built-Up Multiple Printed Wiring Board" written by Kiyoshi Takagi, published by the Nikkan Kogyo Shimbun Ltd. on Jun. 20, 2006, which is incorporated herein by reference), interlayer insulation layers and conductive-circuit layers are alternately laminated. On the outermost conductive-circuit layer, to electrically connect to an IC, pad groups each having a diameter of 150 μm, a pitch of 150 μm and an arrangement of 50×50 pads (arranged in grids) are formed. On top of the pads, a commercially available solder resist is formed, and openings with a diameter of 100 μm are formed on the pads by a photographic method. Here, connection pads formed from via holes (solder bumps formed directly on the via holes) are made as filled vias. Regarding the degree of surface concavity and convexity relative to the conductor thickness of conductive circuit 158, as shown in FIG. 8(A), the degree of concavity (the hollowed portion from the top surface) (P1) is preferred to be set (−5) μm or less, and as shown in FIG. 8(B), the degree of convexity (the portion protruding from the top flat surface) (P2) is preferred to be set (+5) μm or less. If the degree of concavity exceeds 5 μm (−5 μm), the contact points between solder balls and the connection pads formed from filled vias decrease, causing poor wettability when making solder bumps. As a result, voids in the solder or missing bumps may often occur. On the other hand, if the degree of convexity exceeds 5 μm, the thickness of conductive circuit 158 increases, thus essentially ruling it out for use in products with finer features.

(2) Loading solder balls.
On the surface (the surface to mount an IC) of the printed wiring board manufactured in (1), above a commercially available Rogin-type flux is coated. Then, the printed wiring board is mounted on the suction table of the above-described solder-ball loading apparatus of the present invention, and using a CCD camera, alignment marks on the printed wiring board and ball loading mask are recognized to align the printed wiring board and the ball loading mask. Here, as for the ball loading mask, a metal mask with a thickness in the range of 25 μm-50 μm made of nickel that has openings with a diameter of 110 μm corresponding to the pads on the printed wiring board is used. Other ball loading masks made of SUS or polyimide may also be used. The diameter of the openings formed in the ball loading mask is preferably made 1.1-1.5 times as large as the diameter of the balls to be loaded. Then, a loading cylinder of a size in proportion to the pad region (1.2-3 times as big as the pad region) and 200 millimeters in height is positioned over the printed wiring board, while keeping a clearance twice as high as the solder-ball diameter. On the ball loading mask, which is positioned nearby, solder balls containing Sn 63:Pb 37 (for example, made by Hitachi Metals Ltd.) with a diameter of 80 μm are loaded.

In this example, Sn/Pb solder is used for solder balls. However, a lead-free solder selected from among groups such as Sn with Ag, Cu, In, Bi or Zn may be used. By suctioning air through the upper portion of the loading cylinder (24B), air flow speed between the loading cylinder and the printed wiring board is adjusted in the range of about 5-35 m/sec. to gather the balls in the loading cylinder. Then, by moving ball array mask 16 and printed wiring board 10 at a speed of 40 mm/sec., solder balls are moved, dropped onto the pads through the openings of the ball loading mask, and loaded on the pads. Next, after removing excess solder balls from the ball loading mask, the solder-ball loading mask and the printed wiring board are removed separately from the solder-ball loading apparatus. For example, the ball loading mask is released and removed from the mask clamp, and then the printed wiring board is taken off from the suction table. Lastly, the printed wiring board manufactured in the above process is put into a reflow furnace with a temperature set at 230° C. to form solder bumps.

COMPARATIVE EXAMPLE

Except that the method for supplying pads with solder balls is changed, the rest is the same as in the Example described above. Namely, using a conventional method, solder balls are moved by a squeegee and dropped through the ball loading openings to be loaded onto pads.

Evaluation Test

After the reflow process, 50 solder bumps are picked at random and their bump heights from the top of the solder resist are measured using a laser microscope "VX-8500" made by Keyence Corp.

Results

|  | average height of bumps | dispersion of bump heights |
|---|---|---|
| Example | 35.22 μm | 1.26 |
| Comp. Exp. | 32.64 μm | 2.00 |

From the above results, it is found that even if the same solder balls are used, in the Example of the present invention, the bumps are higher and the height dispersion is smaller. One reason for this is that, in the Example of the present invention, solder balls are not shaved by a squeegee or the like, and thus the initial volume of the solder balls is preserved when being loaded onto the pads.

In addition, 100 units of printed wiring boards obtained in the Example and the Comparative Example were prepared, ICs were mounted and the electrical continuity was checked to calculate the manufacturing yield. The resulting yield was 100% among the units of the Example, but among the units of the Comparative Example, the yield was 76%. Then, ten units of each example that showed satisfactory results were picked at random and put under heat cycle tests. A heat cycle test, −55° C.×5 minutes ⇔125° C. ×5 minutes, was conducted 1,000 times. After that, the change in connection resistance values on a certain circuit was measured. The circuit was connected from the bottom surface (the opposite surface to the IC mounted surface) of a printed wiring board, via an IC on the top surfaces, to the bottom surface again. The change in connection resistance values was calculated as ((connection resistance value after heat cycle tests−initial connection resistance value)/initial connection resistance value)×100. If the figure exceeds 10%, it is considered to be inferior. The results were:

|  | number of inferior units |
|---|---|
| Example | 0 |
| Comp. Exp. | 3 |

From the above result, it is found that in the Example of the present invention, the connection reliability of bumps is high, since the dispersion in bump heights is small.

In the Example, loading cylinder 24 is structured with a conductive metal such as SUS stainless steel, nickel, or copper, and grounded to the area where solder-ball loading apparatus 20 is positioned. Here, when moving solder balls on ball array mask 16 to feed them, even if the solder balls are charged from colliding with each other, lightweight and small-diameter solder balls will not stick to loading cylinder 24 due to static electricity. Accordingly, the solder balls can be securely loaded onto the printed wiring board. In addition, as for loading cylinder 24, the following material may also be used: conductive resin containing black lead powder, conductive metal film 23 such as aluminum coated on the surface of the resin member by deposition or the like, or conductive metal foil (23*f*) laminated on the bottom edge and the interiors of resin member 21.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of loading solder balls onto pads of a printed wiring board, comprising:
providing solder balls onto a surface of a ball array mask having a plurality of openings that are aligned with pads on a printed wiring board;
positioning a cylinder member having an opening portion over the ball array mask such that the opening portion of the cylinder member faces the surface of the ball array mask having the solder balls thereon;
suctioning air from a suction section within the cylinder in order to suction air flow into the cylinder member through the opening portion of the cylinder member;
adjusting a speed to the air flow so as to gather together at least some of the solder balls in a pile on and in contact with the surface of the ball array mask under the opening portion of the cylinder member so that the solder balls can be dropped onto the pads through the openings of the ball array mask; and
moving the ball array mask and the printed wiring board relative to the cylinder member in order to move the pile of solder balls gathered together under the opening portion of the cylinder member such that the pads of the printed wiring board are loaded, by dropping the solder balls through the plurality of openings of the ball array mask.

2. The method of claim 1, wherein said providing comprises providing solder balls having a diameter of less than 200 μm.

3. The method of claim 1, wherein said providing comprises providing solder balls having a diameter of 40 μm to 200 μm.

4. The method of claim 1, wherein said positioning comprises positioning the cylinder member above the ball array mask with a clearance of 100-300% of a diameter of the solder balls.

5. The method of claim 1, wherein said providing comprises providing the solder balls onto the surface of a ball array mask having openings each having a diameter of 1.1-1.5 times a diameter of the solder balls.

6. The method of claim 1, wherein said positioning comprises positioning a cylinder member having an opening portion size which is 1.2-3 times a diameter of the pads.

7. The method of claim 1, wherein said suctioning comprises providing an airflow in the range of 5 m/second-50 m/second.

8. The method of claim 1, wherein said suctioning comprises providing an airflow in the range of 5 m/second-35 m/second.

9. The method of claim 1, wherein the solder balls gathered on the surface comprise multiple solder balls loosely aggregated under the loading cylinder.

10. The method of claim 1, wherein the cylinder is held in a fixed position.

11. The method of claim 1, wherein said suctioning comprises providing an airflow which draws the solder balls from a peripheral region of the cylinder member toward a center of the cylinder member such that the at least some solder balls gather in said pile on the mask toward a central region under the cylinder member.

* * * * *